(12) United States Patent
Talbot et al.

(10) Patent No.: US 7,227,382 B1
(45) Date of Patent: Jun. 5, 2007

(54) TRANSMIT BASED EQUALIZATION USING A VOLTAGE MODE DRIVER

(75) Inventors: Gerald R. Talbot, Concord, MA (US); Rohit Kumar, San Jose, CA (US); Stephen C. Hale, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 114 days.

(21) Appl. No.: 11/048,440

(22) Filed: Feb. 1, 2005

(51) Int. Cl. *H03K 19/0175* (2006.01)
(52) U.S. Cl. .......................... 326/87; 326/83
(58) Field of Classification Search ............. 326/82–87
See application file for complete search history.

(56) References Cited

U.S. PATENT DOCUMENTS

| | | | |
|---|---|---|---|
| 5,739,707 A * | 4/1998 | Barraclough | 327/112 |
| 6,166,563 A * | 12/2000 | Volk et al. | 326/87 |
| 6,393,062 B1 | 5/2002 | Furman et al. | |
| 6,518,792 B2 | 2/2003 | Jong et al. | |
| 6,704,818 B1 * | 3/2004 | Martin et al. | 710/100 |
| 6,794,909 B1 * | 9/2004 | Urakami et al. | 327/112 |
| 6,909,305 B1 * | 6/2005 | Li et al. | 326/30 |

OTHER PUBLICATIONS

Dally, W., et al, *Digital Systems Engineering*, Cambridge University Press, 1998, pp. 95-99, 110-111, 145-146, 362-366, 514-522, 526, 529, 565-566.
U.S. Appl. No. 11/033,757, filed Jan. 13, 2005.

* cited by examiner

*Primary Examiner*—Don Le
(74) *Attorney, Agent, or Firm*—Meyertons Hood Kivlin Kowert & Goetzel, P.C.; Erik A. Heter; B. Noël Kivlin (57) ABSTRACT

A driver circuit. In one embodiment, the driver circuit includes a plurality of pull-up circuits and a plurality of pull-down circuits. The driver circuit also includes control logic that is coupled to activate/deactivate the pull-up and pull-down circuits. The driver circuit may perform emphasized signal transmissions having a voltage swing of a first magnitude or de-emphasized signal transmissions having a voltage swing of a second magnitude, wherein the first magnitude is greater than the second magnitude. The control logic is further configured to activate and/or deactivate pull-up and/or pull-down circuits such that the driver circuit output impedance in the emphasized mode is substantially equal to the output impedance in the de-emphasized mode.

43 Claims, 6 Drawing Sheets

TRANSMIT BASED EQUALIZATION USING A VOLTAGE MODE DRIVER

BACKGROUND OF THE INVENTION

1. Field of the Invention

This invention relates to electronic circuits, and more particularly, driver circuits in digital systems.

2. Description of the Related Art

The signaling conventions used in a digital system may to a large extent determine its reliability, speed, and power consumption. Careful design of signaling conventions is particularly important to ensure data integrity in high-speed digital systems.

Figure 1A:
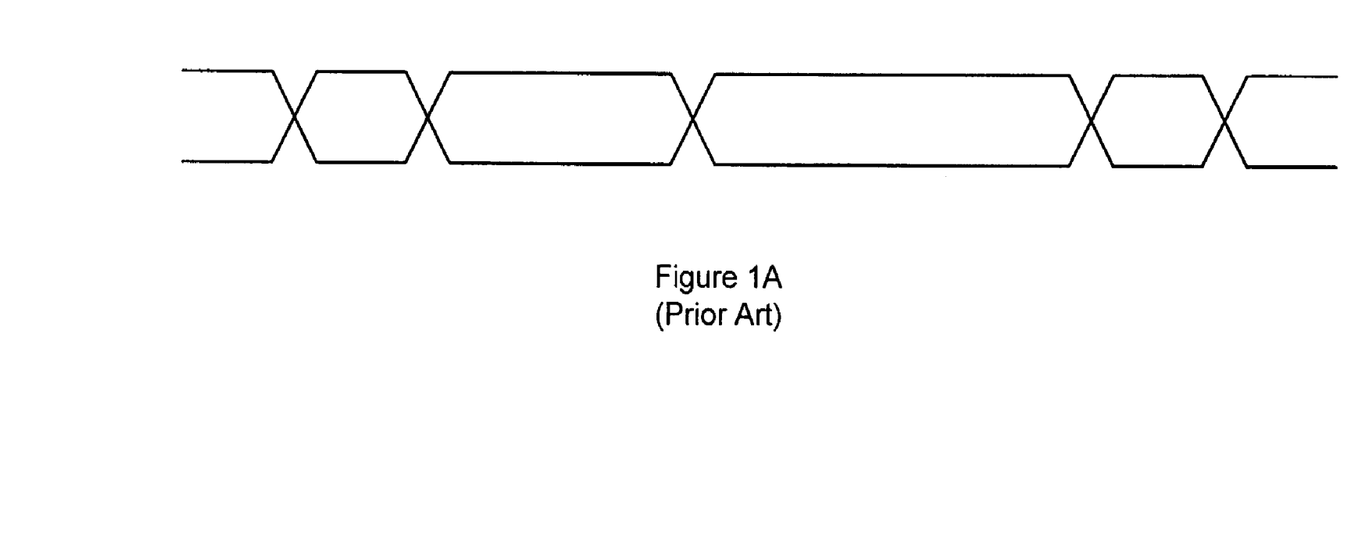
FIG. 1A (Prior Art) is a timing diagram illustrating signal transitions without equalization.
Figure 1B:
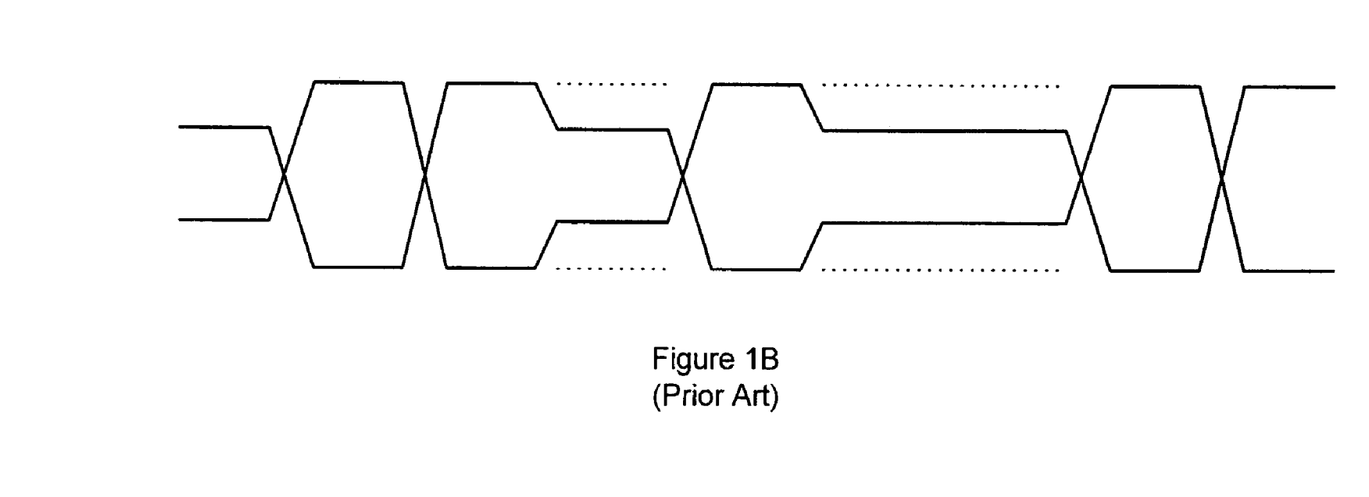
FIG. 1B (Prior Art) is a timing diagram illustrating signal transitions for one embodiment of an equalization (i.e. emphasized) transmission scheme.

One signaling technique that has been developed to ensure data integrity in high-speed digital systems is known as equalization (and may be alternately referred to as pre-emphasis or de-emphasis). Using the technique of pre-emphasis, different drive strengths of signals for a given logic level may be used during certain transitions. FIGS. 1A and 1B illustrate the difference between a traditional signaling convention and one using the technique of equalization. FIG. 1A is a timing diagram illustrating transitions between logic high and logic low voltage levels. The logic high and logic low voltage levels remain substantially the same throughout. The voltage level after a logic level transition (either high-to-low or low-to-high) is substantially the same as for a subsequent cycle where no transition occurred.

In contrast, FIG. 1B is a timing diagram illustrating signal transmissions in which the technique of equalization is used. In this particular example, the voltage levels of a logic high signal or a logic low signal are greater in magnitude on a cycle immediately following a transition. On those cycles subsequent to a transition where no further transition occurs, the voltage for that particular logic level is less in magnitude. Thus, for this particular example, there are effectively two voltage levels for each of logic high and logic low states: the emphasized level that signals are driven to on the low-to-high and high-to-low transitions, and the non-emphasized levels (which may also be referred to as a de-emphasized level) that signals are driven to when no logic level transition occurs from the previous cycle. This technique may be particularly useful for combating negative effects such as high frequency dependent loss which manifests itself as data dependent jitter or intersymbol interference (ISI).

Another important factor in designing a signaling convention is the design of the driver circuits which transmit digital signals. In particular, designing a driver circuit with a controlled, pre-determined output impedance is important to counter negative transmission line effects (e.g., reflections) that may otherwise occur if the output impedance is not controlled. Driver circuits designed for voltage-mode signaling typically have a very low output impedance, while driver circuits designed for current-mode signaling typically have a very high output impedance. Source terminated signaling requires that the output impedance of a driver circuit be matched to a transmission line to which it is coupled. Current mode driver circuits in parallel with a terminating resistor are underterminated. Current mode driver circuits are currently preferred by many designers, since they do not require the accurate voltage references required by voltage mode drivers. However, power consumption by current mode driver circuits may be significantly greater than that of voltage mode driver circuits, since a current mode driver circuit must source a greater amount of current into the shunt terminating resistor as well as the load to allow for a given logic voltage swing in comparison to a voltage mode driver circuit.

As noted above, voltage-mode driver circuits typically have low output impedance, and this impedance must be carefully matched to the transmission line coupled to the driver circuit. The necessity for accurate impedance matching between a driver circuit and a transmission line may make it difficult to design a voltage mode driver circuit configured to implement the technique of equalization, since output impedance must be controlled and matched for both emphasized and non-emphasized signal transmissions.

SUMMARY OF THE INVENTION

A driver circuit is disclosed. In one embodiment, the driver circuit includes a plurality of pull-up circuits and a plurality of pull-down circuits. The driver circuit also includes control logic that is coupled to activate/deactivate the pull-up and pull-down circuits. The driver circuit may perform emphasized signal transmissions having a voltage swing of a first magnitude or de-emphasized signal transmissions having a voltage swing of a second magnitude, wherein the first magnitude is greater than the second magnitude. The control logic is further configured to activate and/or deactivate pull-up and/or pull-down circuits such that the driver circuit output impedance in the emphasized mode is substantially equal to the output impedance in the de-emphasized mode.

In one embodiment, during an emphasized transmission of a logic high signal, a plurality of the pull-up circuits are activated, wherein a first voltage is present on the signal node of the driver circuit. If no pull-down circuits are activated, the pull-down circuits provide a very high resistance (theoretically, this resistance is infinite, although in practice there is some leakage current through the pull-down circuits even when none are activated). During a de-emphasized transmission of a logic high signal, a plurality of pull-up circuits is activated along with at least one of the pull-down circuits, wherein a second voltage that is less than the first voltage is present on the signal node.

During an emphasized transmission of a logic low signal, a plurality of the pull-down circuits are activated, wherein a first voltage is present on the signal node. Similar to the situation of an emphasized logic high transmission, the pull-up circuits will provide a very high resistance when none are activated, although some leakage current will be present. For a de-emphasized transmission of a logic low signal, a plurality of pull-down circuits and at least one pull-up circuit are activated, wherein a second voltage that is greater than the first voltage is present on the signal node.

Multiple embodiments of the pull-up and pull-down circuits are possible and contemplated. In one embodiment, a pull-up circuit includes a transistor having a first terminal coupled to a voltage node and a second terminal coupled to the first terminal of a pull-up resistor. The second terminal of the resistor is coupled to a signal node. Similarly, the pull-down circuits include a transistor having a first terminal coupled to a reference (e.g., ground) node and a second terminal coupled to the first terminal of a pull-down resistor. The second terminal of the pull-down resistor is coupled to the signal node. The control logic may be coupled to a control terminal of each of the transistors (e.g., the gate of a field effect transistor), thereby enabling the control logic to activate or deactivate its associated pull-up/pull-down circuit. Activation of a pull-up circuit in this embodiment tends to pull the voltage present on the signal node towards the voltage present on the voltage node. In various embodiments, the driver circuit is a voltage mode driver.

In another embodiment, the driver circuit includes a plurality of transmitter circuits. Each transmitter circuit includes a pull-up transistor coupled between a voltage node and a common node, and a pull-down transistor coupled between the common node and a reference node. A first terminal of a resistor is coupled to the common node, while a second terminal of the resistor may be coupled to the common node of another transmitter circuit, or coupled to the signal (i.e. output) node of the driver circuit (in the case of a last one of the plurality of transmitter circuits). A resistor coupled by its first terminal to the common node of a last one of the transmitter circuits may be coupled to a signal node (and thus a transmission line), and may provide the output impedance for this particular embodiment.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2:
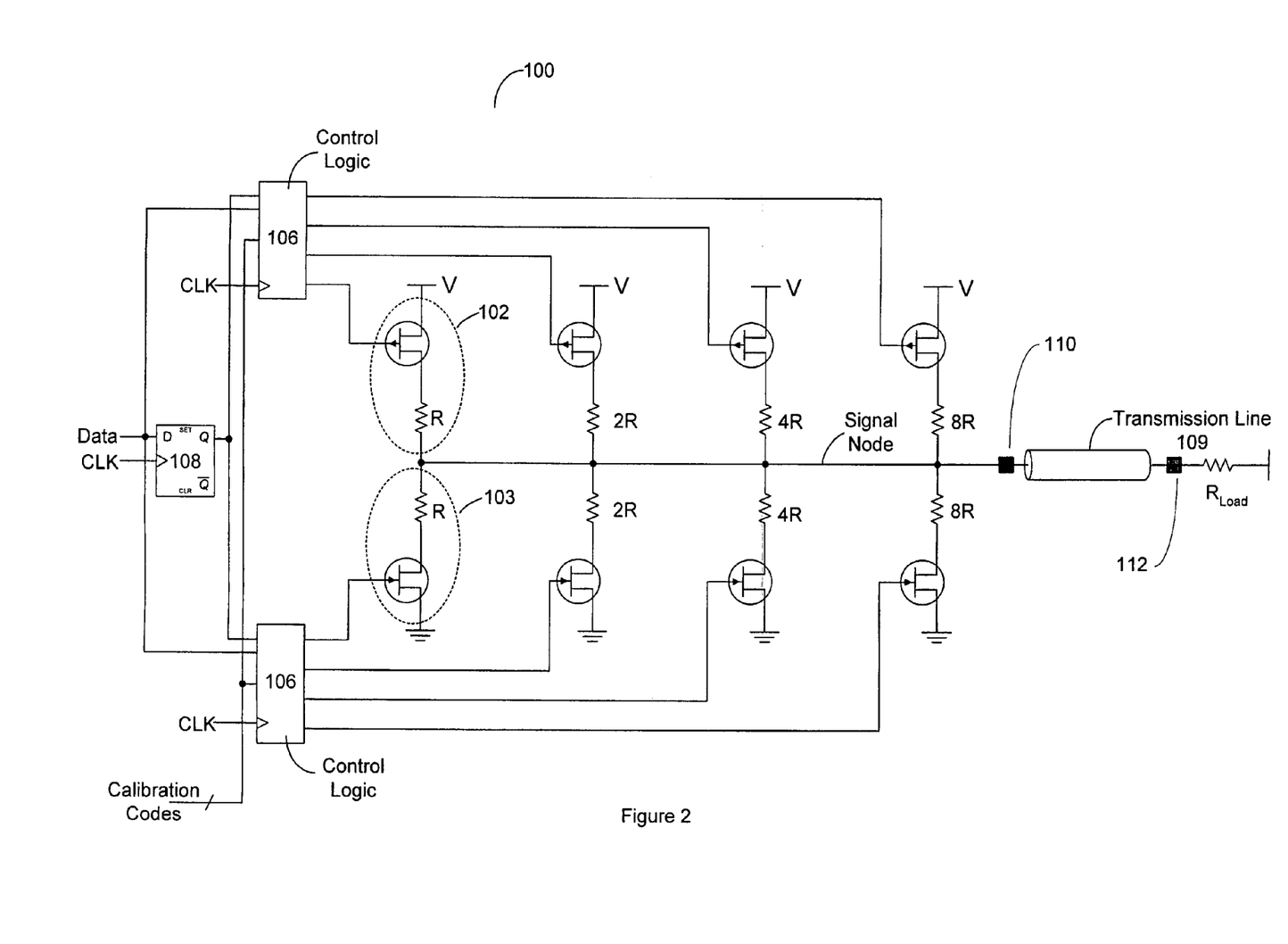
FIG. 2 is a schematic diagram of one embodiment of a driver circuit.

Turning now to FIG. 2, a schematic diagram of one embodiment of a driver circuit is shown. In the embodiment shown, driver circuit 100 includes a plurality of pull-up circuits 102 and a plurality of pull-down circuits 103. Each pull-up circuit 102 includes a transistor (a field effect transistor, or FET for this embodiment) and a resistor. First and second terminals (e.g., a source and drain, respectively, in this example) of the transistor of each pull-up circuit 102 are coupled between a voltage node and a first terminal of a pull-up resistor. A second terminal of the pull-up resistor is coupled to a signal node.

Driver circuit 100 also includes a plurality of pull-down circuits. Each pull-down circuit 103 includes a transistor (also a FET in this embodiment) having a first terminal coupled to a reference node (e.g., a ground node) and a second terminal coupled to a first terminal of a pull-down resistor. A second terminal of the pull-down resistor is coupled to the signal node.

In the embodiment shown, the resistors of pull-up circuits 102 and pull-down circuits 103 are discrete resistors (i.e. separate from the transistors). These discrete resistors may be implemented on the same silicon die as other portions of driver circuit 100. Methods of implementing discrete resistors on the same silicon die as the other portions of driver circuit 100 will be well known to those skilled in the art. It should further be noted that in some embodiments, in lieu of implementing discrete resistors, resistances that are characteristic of the transistors themselves (e.g., resistance encountered by current flowing between a source terminal and a drain terminal) are possible and contemplated.

Data to be transmitted by driver circuit 100 may be received via a data input circuit 108. In the embodiment shown, data input circuit 108 is a D-type flip-flop. Data input circuit 108 is coupled to control logic 106. In this particular embodiment, control logic 106 is shown as two separate units for illustrative purposes, although the control logic may be implemented as a single unit. Control logic 106 is coupled to a control terminal (e.g., a gate terminal for the FETs shown in this embodiment) for each transistor in the pull-up and pull-down circuits 102 and 103, respectively, of driver circuit 100. Control logic 106 is configured to activate or deactivate each of these transistors (and thus their respective pull-up or pull-down circuit) independently of the other transistors. For example, control logic 106 may activate a single one of the pull-up circuits 102 independently of the state (i.e. activated or deactivate) of any of the other pull-up circuits 102 or pull-down circuits 103.

As previously noted, data input circuit 108 is coupled to control logic 106. More particularly, data input circuit 108, in this embodiment, is coupled such that both an input signal received by data input circuit 108 and an output signal provided by data input circuit 108 are provided to control logic 106. This arrangement may allow control logic 106 to detect whether or not a logic low-to-high transition or a logic high-to-low transition is to occur. In one embodiment, control logic 106 is configured to cause signals transmitted by driver circuit 100 in such a transition to be transmitted as emphasized signals. The voltage swing of an emphasized signal is greater in magnitude than for signals that are de-emphasized, such as shown in FIG. 1B. Details of the manner in which control logic 106 causes a signal to be emphasized of de-emphasized will be discussed in further detail below.

It should also be noted that control logic 106 may be further configured to store signal states previous to the current signal state if it is desired to use a more complex emphasis/de-emphasis scheme than that shown in FIG. 1B.

Driver circuit 100 is coupled to a load circuit, represented here by $R_{load}$, via a transmission line 109. The load circuit may be a receiver circuit configured to receive the signal transmitted by driver circuit 100. Pads 110 and 112 may also be present, particularly in the case where the driver circuit 100 and the load circuit are implemented on different silicon die, although it is understood that embodiments where driver circuit 100 and the load circuit are part of the same silicon die are also possible and contemplated. In order to prevent undesired effects on transmission line 109 (e.g., signal reflections) that may affect data integrity, driver circuit 100 is configured to match its output impedance (as seen on the signal node) with the impedance of the circuit to which it is connected. This impedance matching is performed by driver circuit 100 for both emphasized signal transmission and de-emphasized signal transmissions.

In the embodiment of driver circuit 100 shown in FIG. 2, the resistors are binary weighted. That is, for each successive pull-up/pull-down circuit, the pull-up/pull-down resistance is twice as great as the resistance of the previous pull-up/pull-down circuit. In the driver circuit shown in FIG. 2, the resistances are arranged such that values of R, 2R, 4R, and 8R are present for each of the pull-up circuits 102 and pull-down circuits 103. The amount of resistance between the voltage node V and the signal node for a given transmission is the parallel combination of the resistances provided by the activated pull-up circuits 102. Similarly, the amount of resistance between the signal node and ground for a given transmission is the parallel combination of the resistances provided by the activated pull-down circuits 103.

Depending on the type of signal transmissions, pull-up or pull-down circuits may be activated, or a combination of the two may be activated. In one embodiment, only various ones of the pull-up circuits 102 are activated when conducting emphasized logic high signal transmissions. In this same embodiment, only various ones of the pull-down circuits 103 are activated when conducting emphasized logic low transmissions. For de-emphasized signal transmissions (logic high and logic low), both pull-up and pull-down circuits may be activated.

The combination of pull-up circuits 102 and pull-down circuits 103 effectively forms a voltage divider circuit (as will be discussed further in reference to FIG. 5). When driver circuit is transmitting a logic high signal, control logic 106 may activate a plurality of plurality of pull-up circuits 102 by driving the appropriate voltage to their respective transistor gate terminals. Additionally, at least one pull-down circuit may be activated, particularly if transmitting a logic high signal in the de-emphasized mode (it may not be necessary to activate any of pull-down circuits during emphasized logic high transmissions). The pull-up circuits are activated such that any resistance between the voltage node and the signal node is less than that provided by the pull-down circuits (whether or not any are activated). Thus, the voltage divider circuit formed by the activation of the pull-up circuits 102 and the pull-down circuits 103, whether any are activated or not, tends to pull the voltage up towards the voltage level of the voltage node V.

Similarly, when driver circuit 100 is transmitting a logic low signal, a combination of pull-up circuits 102 and pull-down circuits 103 are activated such that the resistance between the signal node and ground is less than the resistance between the signal node and the voltage node V. Thus, the voltage divider circuit formed by the activation of pull-up circuits 102 and pull-down circuits 103 tends to pull the voltage down towards ground during a logic low signal transmission.

When driver circuit 100 is transmitting a logic high signal in an emphasized mode, the combination of activated pull-up circuits 102 and pull-down circuits 103 (whether any are activated or not) will result in a first voltage on the signal node. This first voltage will be greater than a second voltage on the signal node when driver circuit 100 is transmitting a logic high signal in the de-emphasized mode. Various combinations of pull-up circuits 102 and pull-down circuits 103 may be activated in order to achieve the first and second voltages. For example, in the example shown in FIG. 2, a logic high transmission in the emphasized mode may involve activating three different pull-up circuits 102, while a logic high transmission in the de-emphasized mode may involve activating only two pull-up circuits 102 along with a single pull-down circuit 103.

In the binary weighted embodiment of FIG. 2, the various pull-up and pull-down resistances may also be varied by selectively activating specific ones of the pull-up circuits 102 and pull-down circuits 103 based on their respective resistances. For example, a logic high transmission in the emphasized mode may be performed by activating the pull-up circuits 102 corresponding with the 8R, 4R, and 2R resistances. In a logic high transmission in the de-emphasized mode, the same pull-up circuits may be activated, however, the pull-down circuit corresponding with the 4R resistance may also be activated. Thus, in the de-emphasized mode, the amount of resistance between the signal node and ground is less with respect to the amount of resistance between the signal node and ground for the emphasized logic high transmission.

In general, the difference between voltage levels present on the signal node for an emphasized logic high transmission and a de-emphasized logic high transmission may be achieved by varying the combination of resistances of the pull-up circuits 102 and pull-down circuits 103 such that the voltage level on the signal node is greater for the emphasized logic high transmission than for the de-emphasized logic high transmission. The combinations are chosen such that the output impedance is substantially the same for all signal transmissions, regardless of whether or not they are emphasized. It should be noted that while the embodiments discussed above are described as operating in such a manner that no pull-down circuits 103 are activated during an emphasized logic high transmission (and vice-versa for emphasized logic low transmissions), other embodiments wherein both pull-up and pull-down circuits are activated for all transmissions are possible and contemplated. This ability to activate both pull-up and pull-down circuits for any signal transmission may allow for more precise control of the driver circuit output impedance or voltage swing if such control is necessary.

Resistances may also be varied in a similar manner as discussed above for emphasized logic low transmissions and de-emphasized logic low transmissions. The main difference is that the pull-up circuits 102 and pull-down circuits 103 are activated such that the resistance between the signal node and ground is less than the resistance between the signal node and the voltage node V. For emphasized logic low transmissions, the voltage level present on the signal node will be less than the voltage level present on the signal node for a de-emphasized logic low transmission. That is, the combination of pull-down resistances for an emphasized logic low transmission will pull the signal node voltage down farther than for a de-emphasized logic low transmission.

Since the signal node voltage for an emphasized logic high transmission is greater than that for a de-emphasized logic high transmission, the magnitude of the voltage swing (upon the signal transition to a logic high) is also greater for an emphasized logic high transmission. Similarly, the magnitude of the voltage swing for an emphasized logic low transmission is greater upon the signal transition to a logic low than for a de-emphasized logic low transmission.

It is important to note that control logic 106 is configured to activate pull-up circuits 102 and pull-down circuits 103 such that the output impedance is substantially equal for both emphasized signal transmissions and de-emphasized signal transmissions. In an electronic system, driver circuit 100 may be coupled to transmit a signal to a destination over a transmission line. By matching the output impedance of driver circuit 100 to the impedance presented by the transmission line and the load impedance at the destination, undesired effects (e.g., signal reflections) may be prevented, thereby resulting in improved data integrity.

Driver circuit 100 may be calibrated before operation, and may also be calibrated during the operation of the system in which it is implemented. In particular, driver circuit 100 is calibrated such that it transmits signals in both the emphasized mode and the de-emphasized mode with an output impedance substantially equal to the transmission line/load to which it is coupled. Upon completion of the calibration, calibration codes are provided to control logic 106. These calibration codes indicate which ones of the pull-up and pull-down circuits are to be activated for a given signal transmission. This includes calibration codes for an emphasized logic high transmission, a de-emphasized logic high transmission, an emphasized logic low transmission, and a de-emphasized logic low transmission. Based on these calibration codes, control logic 106 will cause the appropriate pull-up circuits 102 and pull-down circuits 103 to be activated for a given signal transmission.

Control logic 106 is also configured to determine when a given signal transmission is to be transmitted in the emphasized mode or the de-emphasized mode based on the current state of the data signal as well as one or more previous states of the data signal. As shown in FIG. 2, the current state of the data signal may be received by control logic 106 prior to it being latched by data input circuit 108, while the previous state may be received by control logic 106 subsequent to its latching by data input circuit 108. Control logic 106 may also be configured to store additional previous data signal states in embodiments and thus allow determination of whether a signal is to be transmitted in the emphasized mode or the de-emphasized mode based on a particular data pattern. In general, control logic 106 is configured to determined whether a signal transmission is to be emphasized based on a current signal state and one or more previous signal states.

Figure 3:
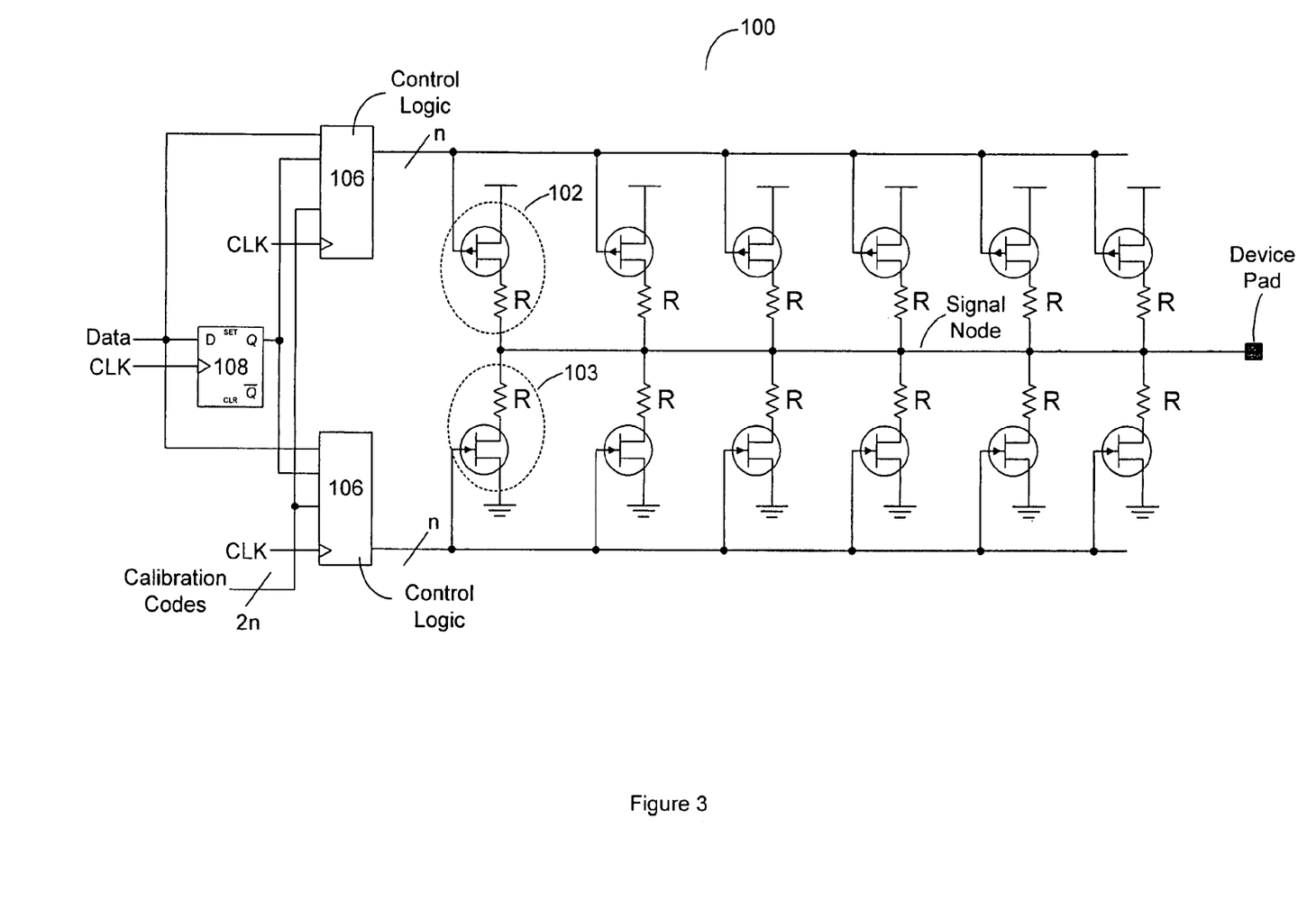
FIG. 3 is a schematic diagram of another embodiment of a driver circuit.

FIG. 3 is a schematic diagram of another embodiment of a driver circuit. Like the embodiment shown in FIG. 2, the embodiment of driver circuit 100 shown in FIG. 3 includes a plurality of pull-up circuits 102, pull-down circuits 103, control logic 106, and data input circuit 108. For the sake of simplicity, individual circuit lines coupling control logic 106 to the gates of the transistors are not shown here, although it is understood that control logic 106 and each of the transistors are coupled in the same manner as shown in FIG. 2. It is also noted that the embodiment shown in FIG. 3 may be coupled to a to a load via a transmission line as is the embodiment shown in FIG. 2, even though the transmission line is not shown here.

The operation of driver circuit 100 shown in FIG. 3 is similar to the operation of the embodiment shown in FIG. 2. However, the resistances in the embodiment of FIG. 3 are not binary weighted as those in FIG. 2. Instead, each of the resistances of the pull-up circuits 102 and pull-down circuits 103 has substantially the same value R. This implementation of driver circuit 100 may be referred to as thermometer decode driver circuit.

In order to conduct logic high signal transmissions with this embodiment of driver circuit 100, enough pull-up circuits 102 are activated such that the parallel resistance between voltage node V and the signal node is less than the resistance provided by any activated pull-down circuits 103. This results in the voltage present on the signal node being pulled up towards the voltage present on voltage node V. Conversely, for logic low transmissions, enough pull-down circuits 103 are activated such that the parallel resistance between the ground node and the signal node is less than the resistance provided by any activated pull-up circuits 102. This results in the voltage present on the signal node being pulled down towards ground.

In conducting emphasized signal transmissions for this embodiment of driver circuit 100, the parallel resistances (pull-up or pull-down) may be incremented in a manner similar to the embodiment of FIG. 2. For example, in order to conduct an emphasized logic high transmission, three pull-up circuits 102 and one pull-down circuit 103 may be activated. For a de-emphasized logic high transmission, two pull-up circuits 102 and one pull-down circuit 103 may be activated for this example. Thus, the voltage present on the signal node will be greater for the emphasized logic-high transmission than for the de-emphasized logic high transmission. It should be noted that additional pull-up circuits 102 and pull-down circuits 103 may be activated if necessary to achieve the desired output impedance. Logic low transmissions are conducted on the same principle except that the resistances are varied in order to cause the voltage on the signal node to be pulled down toward ground, with the voltage being pulled closer to ground for emphasized logic low transmissions than for de-emphasized logic low transmissions.

Although the resistance values of the pull-up circuits 102 and pull-down circuits 103 are substantially equal, other embodiments of the driver circuit of FIG. 3 are possible and contemplated. For example, the values of the resistances may be varied such the each additional resistance added (either to the pull-up side of the circuit or the pull-down circuit) decrements the resistance by substantially equal amounts. In general, the resistances of the pull-up circuits 102 and pull-down circuits 103 may be implemented in whatever manner suitable to ensure that driver circuit 100 has substantially the same output impedance for both emphasized signal transmissions and de-emphasized signal transmissions.

Figure 4:
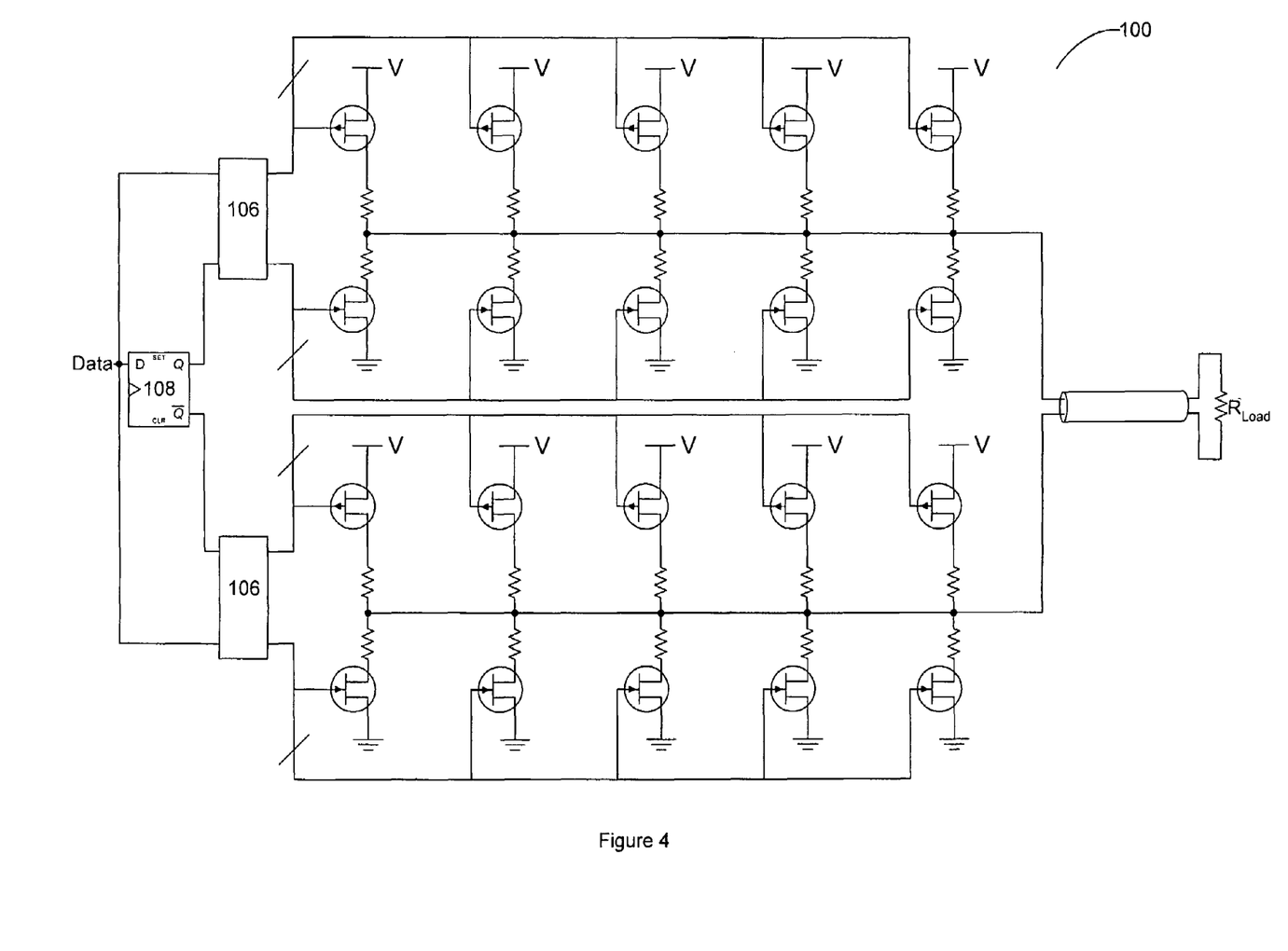
FIG. 4 is a schematic diagram of an embodiment of a driver circuit configured for transmitting differential signals.

FIG. 4 is a schematic diagram of an embodiment of a driver circuit configured for transmitting differential signals. In the embodiment shown, driver circuit 100 essentially implements two driver circuits of the embodiment shown in FIG. 3—one for each signal node of the differential circuit (i.e. + and −). The principle of operation is identical for this embodiment, although the signal transmissions conducted on each signal node will be of the opposite polarity. Thus, when a logic high signal is being transmitted on one of the signal nodes, a logic low is being transmitted on the other signal node. Driver circuit 100 is configured such that emphasized or de-emphasized signal transmissions are conducted on each node simultaneously, e.g., when an emphasized logic high signal is transmitted from one of the signal nodes, an emphasized logic low signal is transmitted on the other signal node. As with the other embodiments discussed herein, pull-up and pull-down circuits of the differential embodiment shown here are activated such that the output impedance is substantially equal for both emphasized signal transmissions and de-emphasized signal transmissions.

Figure 5:
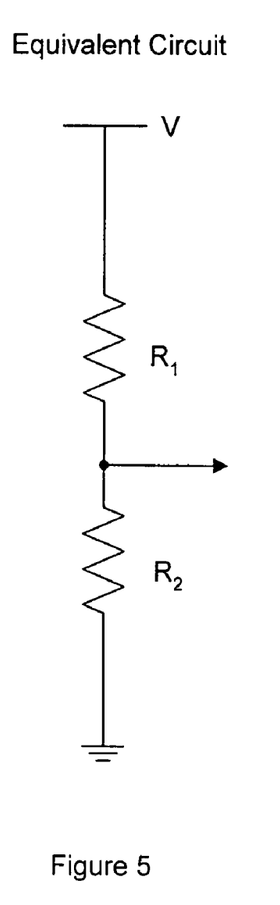
FIG. 5 is a schematic diagram of one embodiment of a circuit that is an equivalent of the driver circuit.
Figure 6:
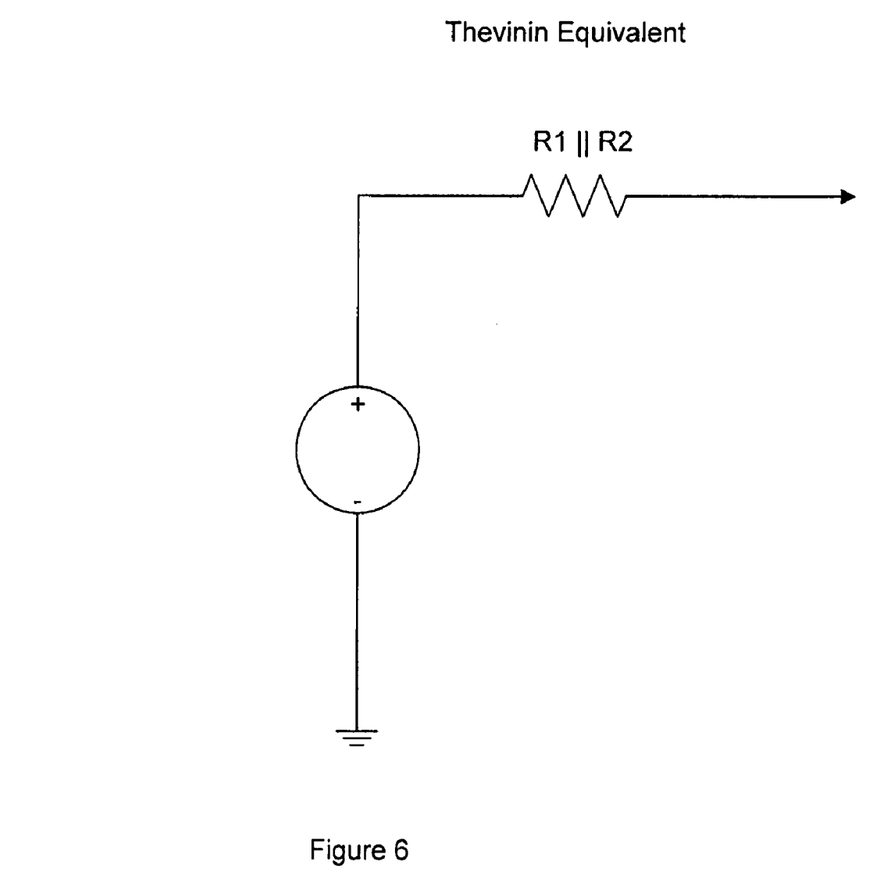
FIG. 6 is a schematic diagram of a circuit that is a Thevinin equivalent circuit of the embodiment shown in FIG. 5.

FIGS. 5 and 6 are presented herein to illustrate the manner in which the output impedance is kept substantially the same for both emphasized and de-emphasized signal transmissions for the various embodiments of driver circuit 100. FIG. 5 is a schematic diagram of one embodiment of a circuit that is an equivalent of the driver circuit during signal transmissions. As previously noted, activation of both pull-up circuits 102 and pull-down circuits 103 essentially form a voltage divider circuit as shown in FIG. 5. The resistance $R_1$ represents the pull-up resistance, while the resistance $R_2$ represents the pull-down resistance. The exact values of $R_1$ and $R_2$ vary with the number of pull-up and pull-down circuits that are activated, which may be as few as zero. If no pull-down circuits 103 are activated (such as for an emphasized logic high transmission), the value of $R_2$ is theoretically infinite, although in reality there is some resistance due to leakage current through the transistors. Similarly, if no pull-up circuits 102 are activated, as may be the case for an emphasized logic low transmission, the value of $R_1$ may be theoretically be infinite, with some actual resistance present due to leakage through the transistors.

In general, the value of $R_1$ will decrease with each additional pull-up circuit that is activated (since a greater number of resistors are in parallel between the voltage node V and the signal node). Similarly, the value of $R_2$ will decrease with each additional pull-down circuit that is activated due to a greater number of resistors being in parallel between the signal node and the ground node. These resistances are varied during the operation of driver circuit 100 in order to allow it to conduct emphasized logic high transmissions, de-emphasized logic high transmissions, emphasized logic low transmissions, and de-emphasized logic low transmissions.

FIG. 6 is a schematic diagram of a circuit that is a Thevinin equivalent circuit of the embodiment shown in FIG. 5. As is well known to those skilled in the art, a Thevinin equivalent of a the circuit such as the one shown in FIG. 5 is a voltage source with a single resistance in series with the voltage source output. This series resistance is the value of $R_1$ in parallel with $R_2$, and represents the output impedance of driver circuit 100. Thus, during the operation of the driver circuit, the values of $R_1$ and $R_2$ are varied such that the parallel combination of these is substantially the same for any given signal transmission. This applies to both logic high and logic low signal transmissions as well as to emphasized and de-emphasized signal transmissions. Thus, by ensuring that the parallel combination of resistances $R_1$ and $R_2$ is substantially equal for all signal transmissions, driver circuit 100 can maintain a substantially constant output impedance, and thus may match the impedance of the circuits to which it is coupled.

The calibration codes received by control logic 106 of the various embodiments of driver circuit may provide the basis for activating various ones of the pull-up circuits 102 and pull-down circuits 103 in order to maintain the output impedance represented by the parallel combination of $R_1$ and $R_2$. As previously noted, the various embodiments of driver circuit 100 may be calibrated during operation of the electronic system in which it is implemented. This may be necessitated due to variations in temperature and other factors which may affect the impedance of the transmission line/load to which the driver circuit is coupled.

Figure 7:
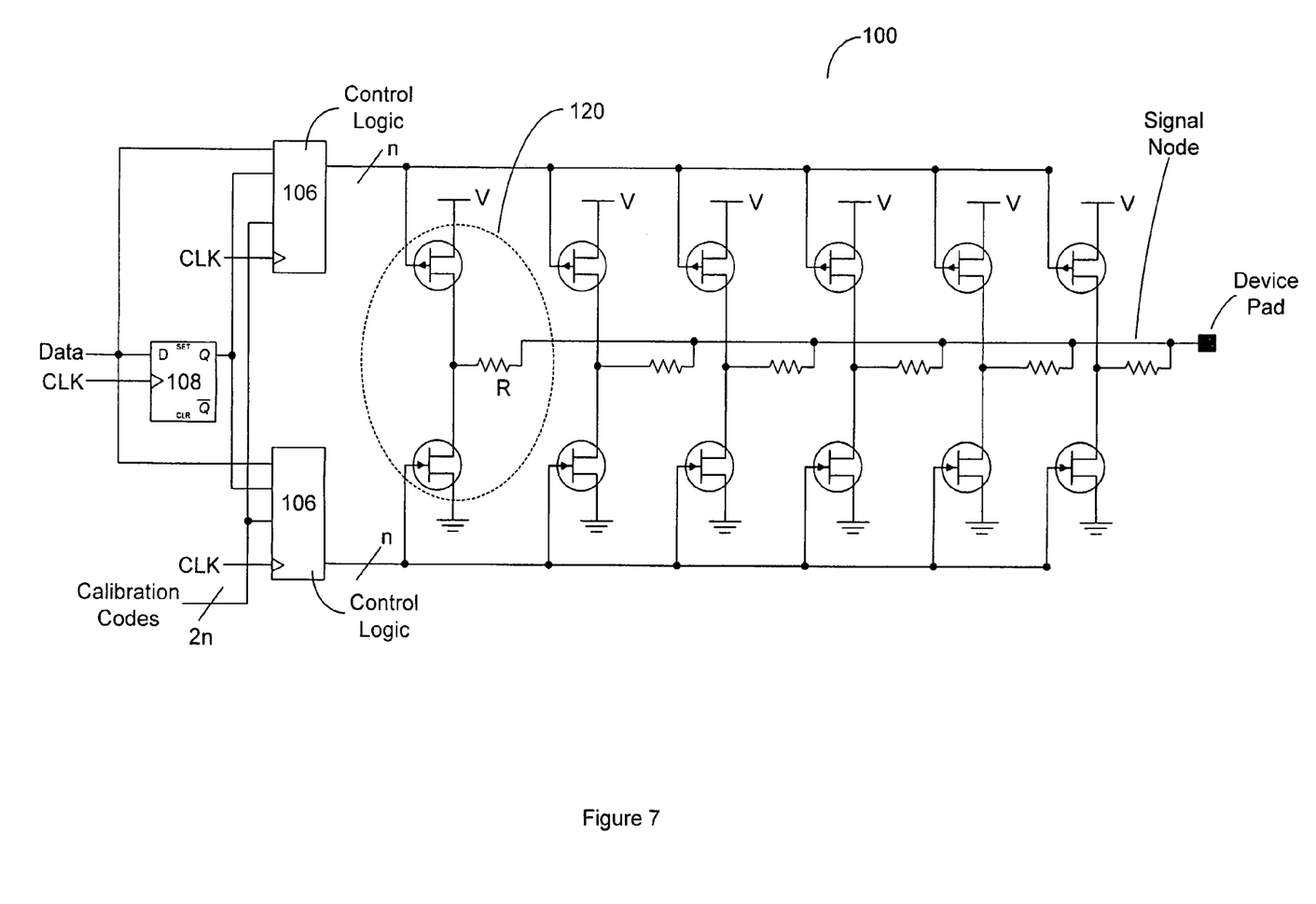
FIG. 7 is a schematic diagram of another embodiment of a driver circuit.

Turning now to FIG. 7, a schematic diagram of another embodiment of a driver circuit is shown. The embodiment shown in FIG. 7 differs from the previously shown embodiments in that it combines each associated pair of pull-up and pull-down resistors into a single resistor.

The driver circuit shown in FIG. 7 includes a plurality of transmitter circuits 120. Each transmitter circuit 120 includes a pull-up transistor having a terminal coupled to a voltage node V, and a pull-down transistor coupled to a reference (e.g., ground) node. Both the pull-up and pull-down transistors are coupled together at a common node (in this particular case, the drain terminals of P-channel and N-channel MOSFETs are coupled together), where a first terminal of a resistor is also coupled. A second terminal of each of the plurality of resistors is coupled to a signal node, which in turn may be coupled to a transmission line as is the embodiment shown in FIG. 2.

As with the embodiments discussed above, the embodiment of driver circuit 100 shown in FIG. 7 includes control logic 106, which is configured to activate or de-activate each of the pull-up and pull-down transistors independently of each other (as with the embodiment of FIG. 2—the individual circuit lines to the transistor gates are combined here for the sake of simplicity). Control logic 106 is also coupled to receive calibration codes, which are used to determine which transistors are activated for emphasized and de-emphasized transmissions.

In this particular embodiment, logic high transmissions (whether emphasized or de-emphasized) may be performed by activating various ones of the pull-up transistors, while leaving all of the pull-down transistors in a de-activated state. For an emphasized logic high transmission, control logic 106 activates a first combination of pull-up transistors such that the resistance between the common node of the last transmitter circuit (also labeled here as the output node) and the voltage node V is less than that for a de-emphasized transmission. During a de-emphasized logic high transmission, a second combination of pull-up transistors is activated, wherein the second combination of pull-up transistors is different from the first (that is, one or more transistors of the first combination is not included in the second combination, or vice versa). Since the resistance between the output node and the voltage node is less for an emphasized transmission, the voltage on the output node will be pulled closer to the voltage present on the voltage node. Thus, the voltage of the transmitted signal will be higher for an emphasized logic high signal than for a de-emphasized logic high signal. However, since the value of the output resistor remains constant, the output impedance is the same for both emphasized and de-emphasized signal transmissions.

It is noted that, in the circuit topology of FIG. 7, that when two or more pull-up transistors are activated with all pull-down transistors de-activated, that the resistors associated with the activated pull-up transistors will effectively be in parallel between the voltage node and the signal node. Similarly, when two or more pull-down transistors are activated while all pull-up transistors remain de-activated, the resistors associated with the activated pull-down transistors will effectively be in parallel between the reference (i.e. ground) node and the signal node.

The principle of operation as it regards logic high transmissions can also be applied to logic low transmissions, with reversed polarities. More particularly, during emphasized logic low transmissions, a first combination of pull-down transistors is activated such that the resistance between the output node and the ground node is less than for a de-emphasized logic low transmission. This causes the voltage on the output node to be pulled closer to ground for an emphasized logic low transmission than for a de-emphasized logic low transmission. During a de-emphasized logic-low transmission, a second combination of pull-down transistors is activated, wherein the second combination is different from the first (as with the case for pull-up transistors in logic high transmissions). As with logic high transmissions, the output impedance is determined by the value of the output resistor, regardless of which transistors are activated.

It should be noted that either the first or second combinations of pull-up or pull-down transistors may include as few as one transistor, and the particular combination of transistors activated for emphasized or de-emphasized transmission may depend, in part, on the arrangement of the resistors in the circuit and their resistance values in relation to each other. In one embodiment of the circuit of FIG. 7, the resistors may be arranged in a binary weighted circuit topology, similar to that of FIG. 2. In another embodiment of the circuit of FIG. 7, the resistors may be arranged in a thermometer coded circuit topology, similar to that of FIG. 3. Other resistor arrangements are also possible and contemplated, and may be tailored to suit the specific application.

The embodiment shown in FIG. 7 may be represented by an equivalent circuit similar to that illustrated in FIG. 6. Although the circuit of FIG. 7 combines the pull-up and pull-down resistors into a single resistor for each transmitter circuit, de-activated transistors may be considered to be a resistor having infinite resistance (although, in practice, some leakage current may exist through the transistors that are de-activated).

Although the embodiment shown in FIG. 7 is configured for single-ended signal transmissions, this particular circuit topology may also be implemented in driver circuits configured to transmit differential signals (similar to the manner in which FIG. 4 implemented previously discussed embodiments for differential signaling).

Although the various embodiments of driver circuit 100 shown herein have been implemented using FETs, embodiments of driver circuit 100 implemented using bi-polar transistors are also possible and contemplated. Furthermore, the various polarities used here (voltage V and ground) are exemplary, and embodiments using other voltages and voltage references are also possible and contemplated. The resistances of the pull-up circuits in the embodiments of FIGS. 2, 3, and 4 may be implemented discretely (i.e. separately from the transistors), or may be implemented as characteristics of the transistors themselves (e.g., as a resistance between the source and the drain of a FET). Finally, while the various embodiments of driver circuit 100 are discussed herein as being implemented on a die as part of an integrated circuit, embodiments of driver circuit 100 implemented using discreet components are also possible and contemplated.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A driver circuit comprising:
   a plurality of pull-up circuits in parallel with each other between a voltage node and a signal node, wherein each pull-up circuit includes a pull-up transistor, wherein each of the plurality of pull-up circuits includes a resistance which is binary weighted with respect to the resistances of other ones of the plurality of pull-up circuits;
   a plurality of pull-down circuits in parallel with each other between the signal node and a reference node, wherein each pull-down circuit includes a pull-down transistor, wherein each of the plurality of pull-down circuits includes a resistance which is binary weighted with respect to the resistances of other ones of the plurality of pull-down circuits;
   control logic coupled to a gate terminal of each pull-up transistor of the plurality of pull-up circuits and a gate terminal of each pull-down transistor of the plurality of pull-down circuits, wherein the control logic is configured to, in an emphasized mode, to cause the driver circuit to transmit logic signals having a voltage swing of a first magnitude, and in a de-emphasized mode, to cause the driver circuit to transmit logic signals having a voltage swing of a second magnitude, wherein the second magnitude is less than the first magnitude, and wherein an output impedance of the driver circuit for transmissions in the emphasized mode and transmissions in the de-emphasized mode is substantially equal.

2. The driver circuit as recited in claim 1, wherein:
   each of the pull-up circuits includes a pull-up resistor, wherein a first terminal of the pull-up transistor is coupled to the voltage node and a second terminal of the pull-up transistor is coupled to a first terminal of the pull-up resistor, and wherein the second terminal of the pull-up resistor is coupled to the signal node; and
   each of the pull-down circuits includes a pull-down resistor, wherein a first terminal of the pull-down transistor is coupled to a reference node and a second terminal of the pull-down transistor is coupled to a first terminal of the pull-down resistor, and wherein a second terminal of the pull-down resistor is coupled to the signal node.

3. The driver circuit as recited in claim 2, wherein the control logic is configured to activate at least one of the plurality of the pull-up circuits when the driver circuit is driving a logic high signal in the emphasized mode, wherein the pull-up circuits that are activated form a first resistance and the pull-down circuits form a second resistance, wherein the second resistance is greater than the first resistance, and wherein a first voltage level is present on the signal node.

4. The driver circuit as recited in claim 3, wherein the control logic is configured to activate at least one pull-up circuit and at least one pull-down circuit when the driver circuit is driving a logic high signal in the de-emphasized mode, wherein, in the de-emphasized mode, the first and second resistances are such that a second voltage level is present on the signal node, wherein the second voltage level is less than the first voltage level.

5. The driver circuit as recited in claim 2, wherein the control logic is configured to activate at least one of the plurality of the pull-down circuits when the driver circuit is driving a logic low signal in the emphasized mode, wherein the pull-up circuits form a first resistance and the pull-down circuits that are activated form a second resistance, wherein the first resistance is greater than the second resistance and wherein a first voltage level is present on the signal node.

6. The driver circuit as recited in claim 5, wherein the control logic is configured to activate at least one pull-down circuit and at least one pull-up circuit when the driver circuit is driving a logic low signal in the de-emphasized mode, wherein, in the de-emphasized mode, the first and second resistances are such that a second voltage level is present on the signal node, wherein the second voltage level is greater than the first voltage level.

7. The driver circuit as recited in claim 2, wherein the resistors of each of the pull-up circuits and each of the pull-down circuits are binary weighted.

8. The driver circuit as recited in claim 1, wherein the control logic activates a first subset of the plurality of pull-up circuits and pull-down circuits for an emphasized signal transmission and a second subset of the plurality of pull-up and pull-down circuits for a de-emphasized signal transmission, wherein the impedance resulting from the corresponding first subset and the corresponding second subset substantially equals the impedance of transmission line to which the signal node is coupled.

9. The driver circuit as recited in claim 1, wherein the driver circuit is a voltage mode driver circuit.

10. The driver circuit as recited in claim 1, wherein the control logic is configured to activate each of the pull-up circuits by driving a signal to its respective pull-up transistor, and wherein the control logic is further configured to activate each of the pull-down circuits by conveying a signal to its respective pull-down transistor.

11. The driver circuit as recited in claim 1, wherein the driver circuit is a single-ended circuit.

12. The driver circuit as recited in claim 1, wherein the driver circuit is a differential circuit having a first plurality of pull-up circuits, a second plurality of pull-up circuits, a first plurality of pull-down circuits, and a second plurality of pull-down circuits.

13. The driver circuit as recited in claim 1 further comprising a data input circuit, wherein the driver circuit is configured to cause a logic level to be generated on the signal node responsive to a logic level received by the data input circuit.

14. The driver circuit as recited in claim 1, wherein the driver circuit is configured to be coupled to a load via a transmission line, and wherein the control logic is configured to match the output impedance of the driver circuit to an impedance of the transmission line.

15. A method comprising:
driving a logic signal from a driver circuit in an emphasized mode, wherein a voltage swing of the logic signal has a first magnitude when driven in the emphasized mode;
driving a logic signal from a driver circuit in a de-emphasized mode, wherein a voltage swing of the logic signal has a second magnitude in the de-emphasized mode, wherein the second magnitude is less than the first magnitude; and
controlling an output impedance of the driver circuit such that the output impedance is substantially equal for both the emphasized mode and the de-emphasized mode,
wherein the driver circuit includes a plurality of pull-up circuits, a plurality of pull-down circuits, wherein each of the plurality of pull-up circuits includes a resistance which is binary weighted with respect to the resistances of other ones of the plurality of pull-up circuits, and wherein each of the plurality of pull-down circuits includes a resistance which is binary weighted with respect to the resistances of other ones of the plurality of pull-down circuits.

16. The method as recited in claim 15, wherein the driver circuit includes control logic coupled to both the plurality of pull-up circuits and the plurality of pull-down circuits.

17. The method as recited in claim 16, wherein the control logic is configured to activate a at least one of the plurality of pull-up circuits when the driver circuit is driving a logic high signal in the emphasized mode, wherein the pull-up circuits that are activated form a first resistance and the pull-down circuits form a second resistance, wherein the second resistance is greater than the first resistance, and wherein a first voltage level is present on the signal node.

18. The method as recited in claim 17, wherein the control logic is configured to activate at least one pull-up circuit and at least one pull-down circuit when the driver circuit is driving a logic high signal in the de-emphasized mode, wherein, in the de-emphasized mode, the first and second resistances are such that a second voltage level is present on the signal node, wherein the second voltage level is less than the first voltage level.

19. The method as recited in claim 16, wherein the control logic is configured to activate at least one of the plurality of pull-down circuits when the driver circuit is driving a logic low signal in the emphasized mode, wherein the pull-up circuits form a first resistance and the pull-down circuits that are activated form a second resistance, wherein the first resistance is greater than the second resistance and wherein a first voltage level is present on the signal node.

20. The method as recited in claim 19, wherein the control logic is configured to activate at least one pull-down circuit and at least one pull-up circuit when the driver circuit is driving a logic low signal in the de-emphasized mode wherein, in the de-emphasized mode, the first and second resistances are such that a second voltage level is present on the signal node, wherein the second voltage level is greater than the first voltage level.

21. The method as recited in claim 15, wherein the control logic activates a first subset of the plurality of pull-up circuits and pull-down circuits for an emphasized signal transmission and a second subset of the plurality of pull-up and pull-down circuits for a de-emphasized signal transmission, wherein the impedance resulting from the corresponding first subset and the corresponding second subset substantially equals the impedance of transmission line to which the signal node is coupled.

22. The method as recited in claim 16, wherein:
each of the pull-up circuits includes a pull-up transistor and a pull-up resistor, wherein a first terminal of the pull-up transistor is coupled to a voltage node and a second terminal of the pull-up transistor is coupled to a first terminal of the pull-up resistor, and wherein a second terminal of the pull-up resistor is coupled to a signal node; and
each of the pull-down circuits includes a pull-down transistor and a pull-down resistor, wherein a first terminal of the pull-down transistor is coupled to a reference node and a second terminal of the pull-down transistor is coupled to a first terminal of the pull-down resistor, and wherein a second terminal of the pull-down resistor is coupled to the signal node.

23. The method as recited in claim 22, wherein the control logic is configured to activate each of the plurality of pull-up circuits by conveying a signal to the gate of its respective pull-up transistor, and wherein the control logic is further configured to activate each of the plurality of pull-down circuits by conveying a signal to the gate of its respective pull-down transistor.

24. The method as recited in claim 16, wherein the driver circuit is a single ended circuit.

25. The method as recited in claim 16, wherein the driver circuit is a differential circuit having first and second pluralities of pull-up circuits and first and second pluralities of pull-down circuits.

26. The method as recited in claim 15, wherein the driver circuit is a voltage mode driver circuit.

27. The method as recited in claim 15 further comprising coupling the driver circuit to a load via a transmission line, wherein the output impedance of the driver circuit is substantially matched to the impedance of the transmission line.

28. An electronic system comprising:
An integrated circuit having at least one driver circuit, wherein the driver circuit includes:
a plurality of pull-up circuits in parallel with each other between a voltage node and a signal node, wherein each of the pull-up circuits includes a pull-up transistor, and wherein each of the plurality of pull-up circuits includes a resistance which is binary weighted with respect to the resistances of other ones of the plurality of pull-up circuits;

a plurality of pull-down circuits in parallel with each other between the signal node and a reference node, wherein each of the pull-down circuits includes a pull-down transistor, and wherein each of the plurality of pull-down circuits includes a resistance which is binary weighted with respect to the resistances of other ones of the plurality of pull-down circuits; and control logic coupled to a gate terminal of each pull-up transistor of the plurality of pull-up circuits and a gate terminal of each pull-down transistor of the plurality of pull-down circuits, wherein the control logic is configured to, in an emphasized mode, to cause the driver circuit to transmit logic signals having a voltage swing of a first magnitude, and in a de-emphasized mode, to cause the driver circuit to transmit logic signals having a voltage swing of a second magnitude, wherein the second magnitude is less than the first magnitude, and wherein the control logic is further configured to control output impedance of the driver circuit such that the output impedance for the emphasized mode and the de-emphasized mode is substantially equal; and a transmission line coupled to the at least one driver circuit, wherein the control logic is configured to substantially match the output impedance of the driver circuit to an impedance of the transmission line.

29. The electronic system as recited in claim 28, wherein:

each of the pull-up circuits includes a pull-up resistor, wherein a first terminal of the pull-up transistor is coupled to a voltage node and a second terminal of the pull-up transistor is coupled to a first terminal of the pull-up resistor, and wherein the second terminal of the pull-up resistor is coupled to a signal node; and each of the pull-down circuits includes a pull-down resistor, wherein a first terminal of the pull-down transistor is coupled to a reference node and a second terminal of the pull-down transistor is coupled to a first terminal of the pull-down resistor, and wherein a second terminal of the pull-down resistor is coupled to the signal node.

30. The electronic system as recited in claim 29, wherein the control logic is configured to activate at least one of the plurality of the pull-up circuits when the driver circuit is driving a logic high signal in the emphasized mode, wherein the pull-up circuits that are activated form a first resistance and the pull-down circuits form a second resistance, wherein the second resistance is greater than the first resistance, and wherein a first voltage level is present on the signal node.

31. The electronic system as recited in claim 30, wherein the control logic is configured to activate at least one pull-up circuit and at least one pull-down circuit when the driver circuit is driving a logic high signal in the de-emphasized mode, wherein, in the de-emphasized mode, the first and second resistances are such that a second voltage level is present on the signal node, wherein the second voltage level is less than the first voltage level.

32. The electronic system as recited in claim 29, wherein the control logic is configured to activate at least one of the plurality of the pull-down circuits when the driver circuit is driving a logic low signal in the emphasized mode, wherein the pull-up circuits form a first resistance and the pull-down circuits that are activated form a second resistance, wherein the first resistance is greater than the second resistance and wherein a first voltage level is present on the signal node.

33. The electronic system as recited in claim 32, wherein the control logic is configured to activate at least one pull-down circuit and at least one pull-up circuit when the driver circuit is driving a logic low signal in the de-emphasized mode, wherein, in the de-emphasized mode, the first and second resistances are such that a second voltage level is present on the signal node, wherein the second voltage level is greater than the first voltage level.

34. The electronic system as recited in claim 28, wherein the control logic activates a first subset of the plurality of pull-up circuits and pull-down circuits for an emphasized signal transmission and a second subset of the plurality of pull-up and pull-down circuits for a de-emphasized signal transmission, wherein the impedance resulting from the corresponding first subset and the corresponding second subset substantially equals the impedance of transmission line to which the signal node is coupled.

35. The electronic system as recited in claim 28, wherein the control logic is configured to activate each of the pull-up circuits by driving a signal to its respective pull-up transistor, and wherein the control logic is further configured to activate each of the pull-down circuits by conveying a signal to its respective pull-down transistor.

36. The electronic system as recited in claim 28, wherein the driver circuit is a voltage mode driver circuit.

37. A driver circuit comprising:

a plurality of transmitter circuits, wherein each transmitter circuit includes:

a pull-up transistor having a first terminal coupled to a voltage node and a second terminal coupled to a common node;

a pull-down transistor having a first terminal coupled to the common node and a second terminal coupled to a reference node; and a resistor having a first terminal coupled to the common node, wherein a second terminal of each resistor of the plurality of transmitter circuits is coupled to a signal node;

control logic coupled to a gate terminal of each pull-up transistor of the plurality of transmitter circuits a gate terminal of each of pull-down transistor of the plurality of transmitter circuits, wherein the control logic is configured to, in an emphasized mode, to cause the driver circuit to transmit logic signals having a voltage swing of a first magnitude, and in a de-emphasized mode, to cause the driver circuit to transmit logic signals having a voltage swing of a second magnitude, wherein the second magnitude is less than the first magnitude, and wherein an output impedance of the driver circuit for transmissions in the emphasized mode and transmissions in the de-emphasized mode is substantially equal.

38. The driver circuit as recited in claim 37, wherein the control logic is configured to activate a first combination of pull-up transistors during logic high transmissions in the emphasized mode.

39. The driver circuit as recited in claim 38, wherein the control logic is configured to activate a second combination of pull-up transistors during logic high transmissions in the de-emphasized mode, wherein the second combination of pull-up transistors is different from the first combination of pull-up transistors.

40. The driver circuit as recited in claim 37, wherein the control logic is configured to activate a first combination of pull-down transistors during logic low transmissions in the emphasized mode.

41. The driver circuit as recited in claim 40, wherein the control logic is configured to activate a second combination of pull-down transistors during logic low transmissions in the de-emphasized mode, wherein the second combination of pull-down transistors is different from the first combination of pull-down transistors.

42. The driver circuit as recited in claim 37, wherein the resistors of the plurality of transmitter circuits are binary weighted.

43. The driver circuit as recited in claim 37, wherein the driver circuit is a thermometer decode driver circuit.

* * * * *